(12) United States Patent
Zarabadi et al.

(10) Patent No.: US 8,643,333 B2
(45) Date of Patent: Feb. 4, 2014

(54) BATTERY STACK CELL MONITOR

(75) Inventors: Seyed R. Zarabadi, Kokomo, IN (US);
Thomas Gerard Block, Carmel, IN (US); Mark R. Keyse, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 341 days.

(21) Appl. No.: 13/221,942

(22) Filed: Aug. 31, 2011

(65) Prior Publication Data
US 2013/0049761 A1 Feb. 28, 2013

(51) Int. Cl.
*H02J 7/00* (2006.01)
*H01M 10/46* (2006.01)
*G01N 27/416* (2006.01)

(52) U.S. Cl.
USPC .......................... 320/116; 324/433

(58) Field of Classification Search
USPC .......................... 320/116; 324/433
See application file for complete search history.

(56) References Cited

U.S. PATENT DOCUMENTS

| | | | |
|---|---|---|---|
| 4,571,533 A * | 2/1986 | Dey | 320/163 |
| 6,268,711 B1 * | 7/2001 | Bearfield | 320/117 |
| 6,404,165 B1 * | 6/2002 | Shinpo et al. | 320/116 |
| 7,417,405 B2 * | 8/2008 | Carrier et al. | 320/116 |
| 7,531,988 B2 * | 5/2009 | Sato | 320/134 |
| 8,130,000 B2 * | 3/2012 | Botker et al. | 324/433 |
| 8,344,794 B2 * | 1/2013 | Li | 327/554 |
| 2006/0098390 A1 * | 5/2006 | Ashtiani et al. | 361/502 |
| 2008/0290842 A1 * | 11/2008 | Davis et al. | 320/166 |
| 2010/0201317 A1 * | 8/2010 | Shiu et al. | 320/116 |

* cited by examiner

*Primary Examiner* — M'Baye Diao
(74) *Attorney, Agent, or Firm* — Lawrence D. Hazelton

(57) ABSTRACT

A battery monitor system for determining a cell voltage between a low side contact and a high side contact of a cell in situ as one of a plurality of cells connected in series to form a battery. The system uses an arrangement of switches and capacitors to shift relatively high absolute voltages of a battery stack to a relative low voltage level so lower voltage electronics can be used to monitor cell voltages. The system may be configured to provide a single ended measurement or a differential measurement indicative of a cell voltage. The differential measurement may be advantageous to correct or offset signal noise caused by electromagnetic interference (EMI).

11 Claims, 4 Drawing Sheets

US 8,643,333 B2

BATTERY STACK CELL MONITOR

TECHNICAL FIELD OF INVENTION

This disclosure generally relates to battery monitor systems, and more particularly relates to a circuit for measuring cell voltages of individual cells forming a battery stack.

BACKGROUND OF INVENTION

It is a known desire to monitor cell characteristics such as cell voltage and cell temperature of individual cells connected in series to form a battery such as a lithium ion battery pack used in a vehicle. Such monitoring may help to maximize performance and/or reliability of the battery. It has been suggested to equip each cell with an integrated circuit that measures cell voltage and communicates that information onto a communication network. However, each integrated circuit requires a high precision voltage reference, and must be configured to interface the potentially high absolute voltage of cells at the top of the stack of cells forming the battery with the relatively low voltages present on a communication network. Such requirements tend to undesirably increase the cost of the integrated circuit and so undesirably increase the cost of a battery monitoring system.

SUMMARY OF THE INVENTION

In accordance with one embodiment, a battery monitor system for determining a cell voltage between a low side contact and a high side contact of a cell in situ as one of a plurality of cells connected in series to form a battery is provided. The system includes a first capacitor, a first and second cell switch, a first reference switch, and a controller. The a first capacitor has a first anode and a first cathode. The first cell switch is connected between the low side contact and the first anode. The second cell switch is connected between the high side contact and the first anode. The first reference switch is connected between a first reference voltage and the first cathode. The controller is configured to operate each switch to a closed state or an opened state in a manner effective to establish a voltage on the first cathode indicative of the cell voltage.

In another embodiment, a battery monitor system for determining a cell voltage between a low side contact and a high side contact of a cell in situ as one of a plurality of cells connected in series to form a battery is provided. The system includes a first and second capacitor, a first, second and third cell switch, a first and second reference switch, and a controller. The first capacitor has a first anode and a first cathode. The first cell switch is connected between the low side contact and the first anode. The second cell switch is connected between the high side contact and the first anode. The first reference switch is connected between a first reference voltage and the first cathode. The second capacitor has a second anode and a second cathode. The third cell switch is connected between the low side contact and the second anode. The second reference switch is connected between a second reference voltage and the second cathode. The controller is configured to operate each switch to a closed state or an opened state in a manner effective to establish a voltage difference between the first cathode and the second cathode indicative of the cell voltage.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
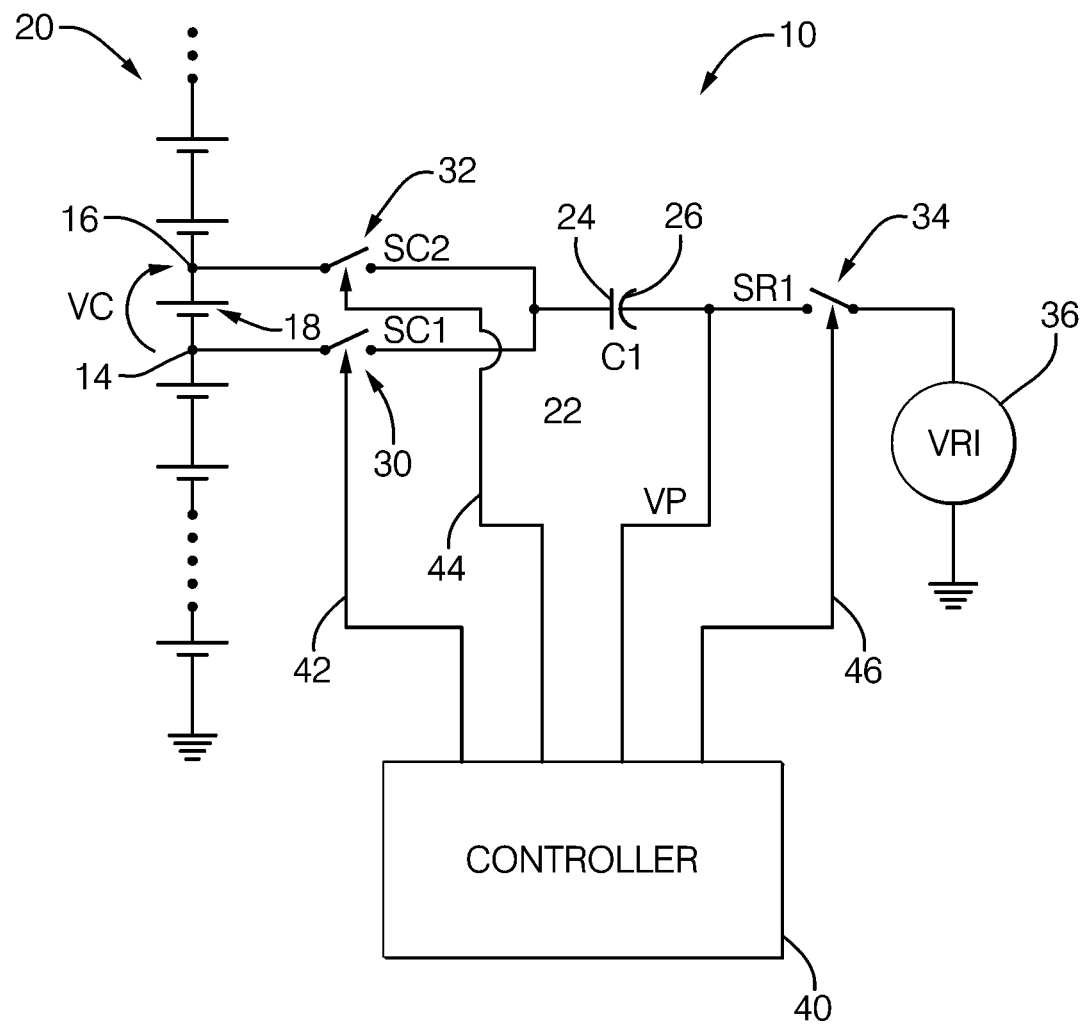
FIG. 1 is a schematic of a battery monitor system in accordance with one embodiment.

FIG. 1 illustrates a non-limiting example of a battery monitor system 10 for determining a cell voltage VC between a low side contact 14 and a high side contact 16 of a cell 18 in situ as one of a plurality of cells connected in series to form a battery 20. Advantages of the system 10 described herein over other battery monitoring systems shown in the prior art is that a single analog-to-digital converter (A/D) and a single voltage reference (VREF) can be used to determine a particular cell voltage independent of the number of cells forming the battery 20. By way of example and not limitation, the battery 20 may be a series connection of ninety-six (96) lithium-ion cells having a typical cell voltage VC of three point seven Volts (3.7V), and so the battery 20 may have a typical output voltage of about three hundred fifty five Volts (355V).

The system 10 may include a first capacitor 22 labeled in FIG. 1 as C1. C1 has a first anode 24 and a first cathode 26. C1 preferably has a large enough capacitor value so anything connected to VP having a capacitive load does not unduly influence any voltage across C1, and is small enough to avoid generating excessive switching currents as the various switches connected to C1 open and close. A suitable value for C1 is ten thousand pico-Farads (10000 pF), however it is recognized that other values may be suitable. C1 should also have a voltage rating that is higher than the highest absolute voltage relative to ground present on the battery 20. For the example battery 20 above, a suitable voltage rating for C1 is six hundred thirty Volts (630V), however it is recognized that a lower voltage rating may be suitable for other applications (e.g. non-vehicle). The first capacitor 22 or C1 should also be selected to have a leakage characteristic low enough so when a relatively high absolute voltage at a contact (14, 16) is coupled to C1 when a cell switch (30, 32) is closed, that absolute voltage does not leak through to VP.

The system 10 may include a first cell switch 30, labeled in FIG. 1 as SC1. As illustrated, SC1 is connected between the low side contact 14 and the first anode 24. The system 10 may also include a second cell switch 32, labeled as SC2 and connected between the high side contact 16 and the first anode 24. The system 10 may also include a first reference switch 34, labeled as SR1 and connected between a first reference voltage 36 (VR1) and the first cathode 26. The first cell switch 30, the second cell switch 32, and the first reference switch 34 may be formed of one or more solid state devices (FIG. 4) such as metal oxide semiconductor field effect transistor (MOSFET), or may be a electromechanical device such as a relay. The first reference voltage 36 may be useful to offset or compensate for any shifts caused by other equipment (not shown) connected to VP.

Figure 4:
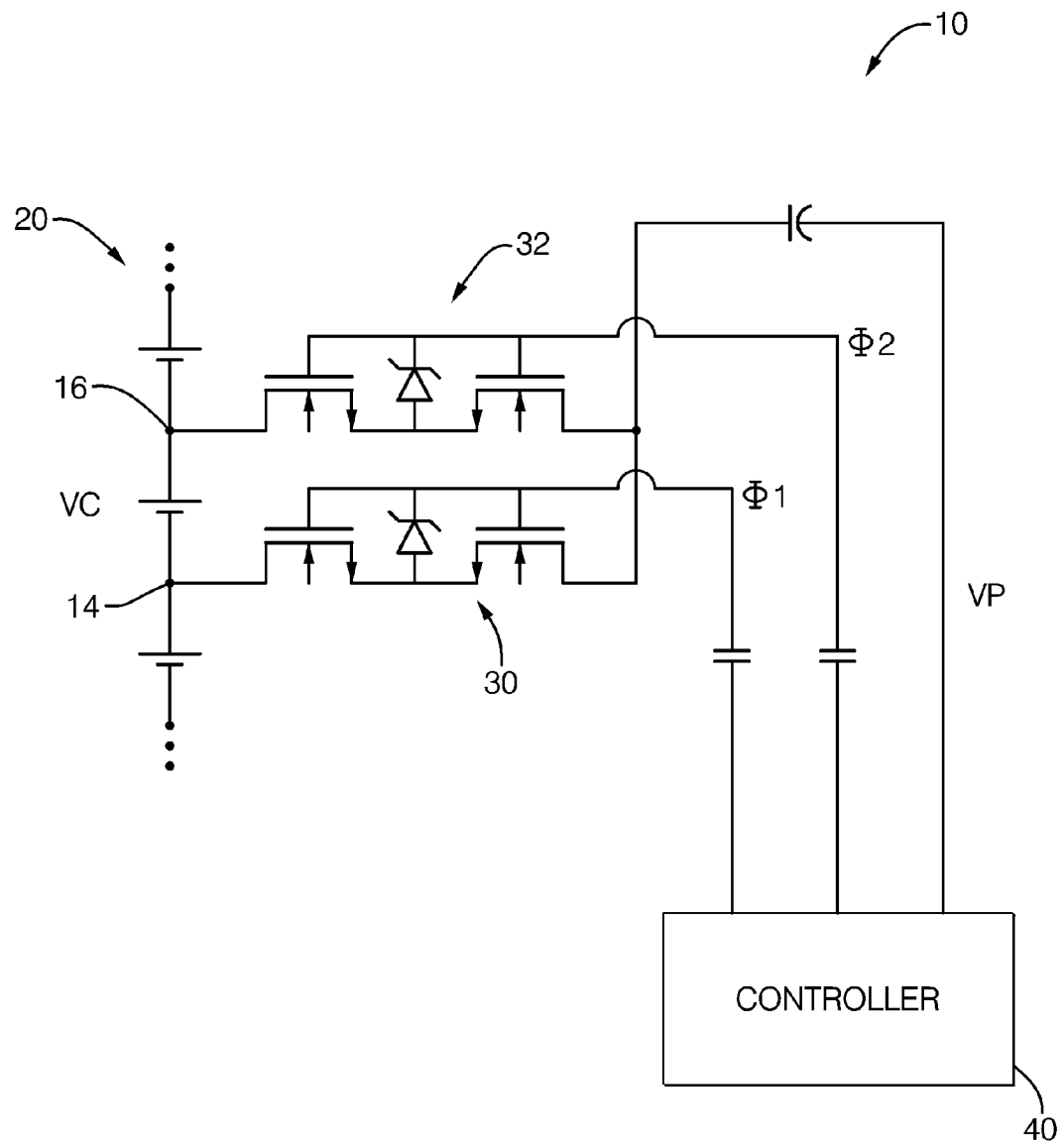
FIG. 4 is a schematic of a switch in the battery monitor system of FIGS. 1 and 2 in accordance with one embodiment.

The system 10 may include a controller 40 configured to operate each switch to a closed state or an opened state. For example, the controller 40 may be configured to output controls signals 42, 44, 46 to the switches 30, 32, 34 as illustrated in FIG. 1. The control signals 42, 44, 46 may directly couple the controller 40 to each of the switches 30, 32, 34 if the switches are relay type devices. Alternatively, the controller 40 may be capacitively coupled to the switches as illustrated in FIG. 4. The controller 40 may include a processor such as a microprocessor or other control circuitry as should be evident to those skilled in the art. The controller 40 may include memory, including non-volatile memory, such as electrically erasable programmable read-only memory (EEPROM) for storing one or more routines, thresholds and captured data. The one or more routines may be executed by the processor to perform steps to control the switches 30, 32, 34 in a manner effective to establish a voltage on the first cathode 26 indicative of the cell voltage VC.

A way of operating the switches 30, 32, 34 to establish a voltage on the first cathode 26, hereafter often VP, indicative of the cell voltage VC will now be described by way of example and not limitation. First, a voltage across C1 equal to the absolute voltage at the low side contact 14 is established. This may include the controller 40 confirming that the second cell 32 switch is in the opened state or operating the second cell 32 to the opened state, and then operating the first reference switch 34 and the first cell switch 30 to the closed state, while continuing to hold the second cell switch 32 in the opened state.

After waiting for a sufficient time for the voltage across C1 to stabilize, ten microseconds (10 us) for example, the controller 40 then operates the first reference switch 34 and the first cell switch 30 to the opened state. Now, both terminals of C1 are electrically floating, and for a period of time dependent on the leakage characteristics of C1, the voltage across C1 is equal to the absolute voltage at the low side contact 14 relative to the first reference voltage 36. If the first reference voltage is zero, then the voltage across C1 is equal the absolute voltage at the low side contact 14 relative to ground. For the purpose of simplifying the explanation, it will be assumed for this example that the first reference voltage 36 is zero. If, for example, the low side contact 14 is the low side of the fiftieth of 96 series connected 3.7V cells, then the absolute voltage at the low side contact 14 relative to ground is 49×3.7V=181.3V.

Then, while the voltage across C1 is approximately equal to 181.3V, the controller 40 operates the second cell switch 32 to the closed state in order to connect the first anode 24 to the high side contact 16. For this example, the absolute voltage at the high side contact 16 relative to ground is 50×3.7V=185.0V. Since the relative voltage across C1 is 181.3, then the absolute voltage on the first cathode is now 185.0−181.3=3.7V, a value corresponding to the cell voltage VC.

If the controller 40 presents an electric load on VP, for example an input capacitance or an input bias current, then the voltage VP may be compensated so VP accurately represents VC by having an appropriate non-zero value for the first reference voltage 36, or VR1. For example if the controller 40 presents an input capacitance to VP, a VR1 value less than zero by an amount dependent on the capacitance value of C1 and the input capacitance may be effective to compensate for a parasitic capacitance presented by the system 10, in this case the input capacitance of the controller 40.

Figure 2:
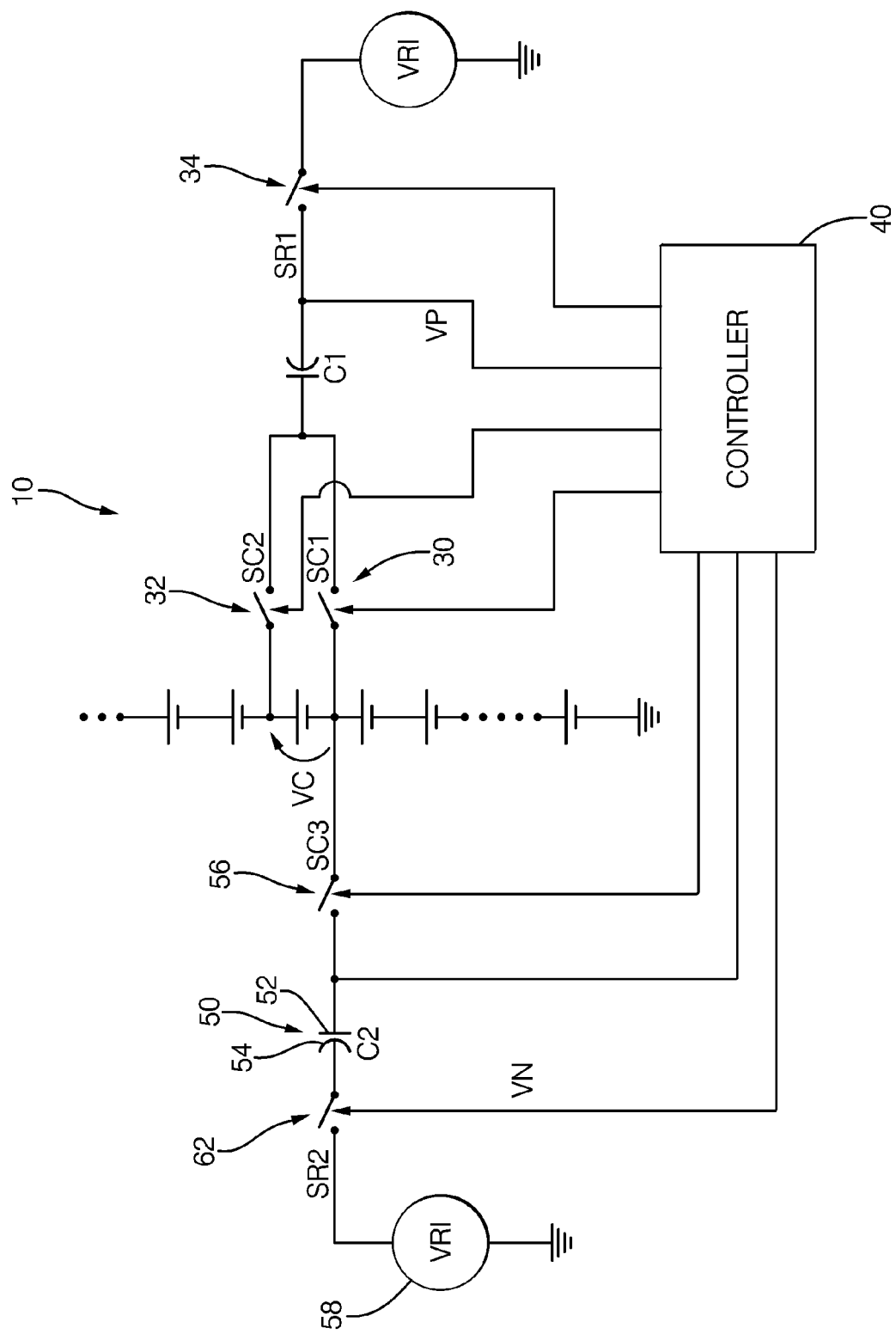
FIG. 2 is another schematic of a battery monitor system in accordance with one embodiment.

FIG. 2 illustrates another embodiment of the battery monitor system 10. As will be described in more detail below, this embodiment provides a differential voltage to the controller 40 indicative of the cell voltage VC. The advantage of providing a differential voltage is that potential measurement errors due to, for example, leakage through C1, or losses through the switches, or EMI induced error may be cancelled by the differential measurement.

Figure 3:
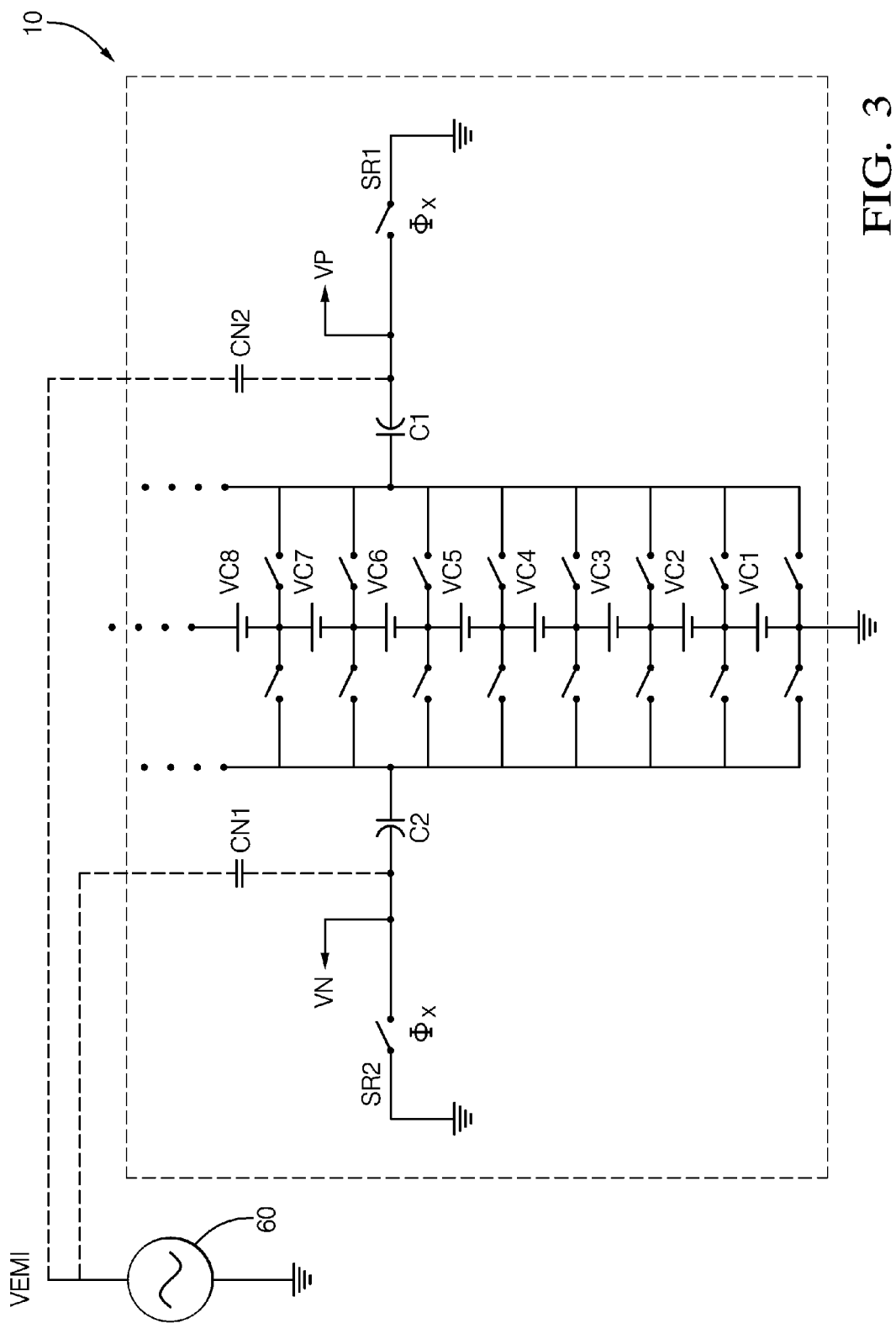
FIG. 3 is a schematic of a battery monitor system illustrating how noise may be injected to the system of FIGS. 1 and 2 in accordance with one embodiment.

FIG. 3 illustrates another example of how providing a differential voltage may be advantageous. During operation, the system 10 may be exposed to various sources of electromagnetic energy such radio waves from broadcast facilities, or electromagnetic energy generated within the vehicles by switching currents or engine spark ignition devices. These various sources of electromagnetic interference (EMI) are illustrated by a noise voltage source 60, labeled VEMI. Coupling of the output of VEMI may be modeled by noise coupling capacitors CN1 and CN2. If the EMI or noise injected into the system 10 is common mode, then making cell voltage measurements differentially may reduce measurement error.

Referring again to FIG. 2 and comparing to FIG. 1, the embodiment illustrated in FIG. 2 adds a second capacitor, labeled C2 and having a second anode 52 and a second cathode 54; a third cell switch 56, labeled SC3 and connected between the low side contact 14 and the second anode 52; and a second reference switch 62, labeled SR2 and connected between a second reference voltage 58 (VR2) and the second cathode 54. For this embodiment, the controller 40 may be configured to operate each switch to a closed state or an opened state in a manner effective to establish a voltage difference between the first cathode 26 and the second cathode 54, i.e.—the voltage difference between VP and VN, indicative of the cell voltage VC.

Similar to the example given above with regard to FIG. 1, the switches 30, 32, 34, 56, 62 may be operated in a particular sequence in order to establish a voltage difference between VP and VN, indicative of the cell voltage VC. The first step performed by the controller 40 may be to operate the first reference switch 34, the second reference switch 62, the first cell switch 30, and the third cell switch 56 to the closed state while the second cell switch 32 is held in the opened state. This establishes the absolute voltage at the low side contact 14 across the capacitors C1 and C2.

After the voltages have stabilized, the controller 40 operates the first reference switch 34, the second reference switch 62, the first cell switch 30, and optionally the third cell switch 56 to the opened state. If capacitor leakage or other secondary effects that may affect the accuracy of the differential voltage measurement are not a problem, then the third cell switch 56 may remain closed. However, if such compensation for such secondary effects is desired, then the third cell switch 56 is preferably opened when the switches 30, 34, 62 are opened.

Next, the controller 40 may operate the second cell switch 32 to the closed state. If the third cell switch 56 was opened in the previous step, then the controller 40 needs to again close the third cell switch before the differential voltage can be measured by the controller 40.

The reference voltages VR1 and VR2 may be set to zero if no corrections are necessary, in which case the reference voltages may be excluded from the system 10. Alternatively, the reference voltages VR1 and VR2 may be set to the same values or to different values depending on potential sources of error in the measurements of VP and VN.

Accordingly, a battery monitor system 10 is provided. The system 10 uses a capacitor (C1, C2) to store a voltage, and an arrangement of switches to shift the stored voltage from a relatively high level that would normally require complicated and expensive electronics to measure, to a relative low voltage level that relatively inexpensive, low voltage electronics can tolerate without being damaged.

While this invention has been described in terms of the preferred embodiments thereof, it is not intended to be so limited, but rather only to the extent set forth in the claims that follow.

We claim:

1. A battery monitor system for determining a cell voltage between a low side contact and a high side contact of a cell in situ as one of a plurality of cells connected in series to form a battery, said system comprising:
   a first capacitor having a first anode and a first cathode;
   a first cell switch connected between the low side contact and the first anode;
   a second cell switch connected between the high side contact and the first anode;
   a first reference switch connected between a first reference voltage and the first cathode; and
   a controller configured to operate each switch to a closed state or an opened state in a manner effective to establish a voltage on the first cathode indicative of the cell voltage.

2. The system in accordance with claim 1, wherein the voltage on the first cathode is indicative of the cell voltage after the switches are operated in the following sequence:
   a) operate the first reference switch and the first cell switch to the closed state while the second cell switch is in the opened state;
   b) operate the first reference switch and the first cell switch to the opened state; and
   c) operate the second cell switch to the closed state.

3. The system in accordance with claim 1, wherein the first reference voltage is a ground reference voltage.

4. The system in accordance with claim 1, wherein the first reference voltage differs from a ground reference voltage by an amount effective to compensate for a parasitic capacitance presented by the system.

5. The system in accordance with claim 1, said system further comprising:
   a second capacitor having a second anode and a second cathode;
   a third cell switch connected between the low side contact and the second anode; and
   a second reference switch connected between a second reference voltage and the second cathode,
   wherein said controller is configured to operate each switch to a closed state or an opened state in a manner effective to establish a voltage difference between the first cathode and the second cathode indicative of the cell voltage.

6. The system in accordance with claim 5, wherein the voltage on the first cathode is indicative of the cell voltage after the switches are operated in the following sequence:
   a) operate the first reference switch, the second reference switch, the first cell switch, and the third cell switch to the closed state while the second cell switch is in the opened state;
   b) operate the first reference switch, the second reference switch, and the first cell switch to the opened state; and
   c) operate the second cell switch to the closed state.

7. The system in accordance with claim 6, wherein step b) also operates the third cell switch to the opened state.

8. The system in accordance with claim 7, wherein step c) also operates the third cell switch to the closed state.

9. The system in accordance with claim 5, wherein the first reference voltage equals the second reference voltage.

10. The system in accordance with claim 9, wherein the first referent voltage and the second reference voltage are both a ground reference voltage.

11. The system in accordance with claim 5, wherein the first reference voltage differs from the second reference voltage by an amount effective to compensate for a parasitic capacitance presented by the system.

* * * * *